United States Patent [19]

Asakawa

[11] Patent Number: 5,348,076
[45] Date of Patent: Sep. 20, 1994

[54] COOLING APPARATUS FOR ELECTRONIC SYSTEM

[75] Inventor: Kyoichi Asakawa, Yamana, Japan

[73] Assignee: NEC Corporation, Japan

[21] Appl. No.: 12,741

[22] Filed: Feb. 3, 1993

[30] Foreign Application Priority Data

Feb. 6, 1992 [JP] Japan ................................. 4-054197

[51] Int. Cl.⁵ ...................... F28F 27/00; H01L 23/473
[52] U.S. Cl. ......................................... 165/13; 165/34;
165/40; 165/104.33; 417/3; 417/6; 361/699
[58] Field of Search ................. 165/13, 34, 40, 104.33;
417/3, 6; 361/699

[56] References Cited

U.S. PATENT DOCUMENTS 3,995,687 12/1976 Euler ....................................... 165/13
4,729,424 3/1988 Mizuno et al. ......................... 165/30

Primary Examiner—Albert W. Davis, Jr.
Attorney, Agent, or Firm—Laff, Whitesel, Conte & Saret

[57] ABSTRACT

A cooling apparatus for an electronic system, includes a coolant tank, main pumps, heat exchangers, a common supplementary pump, and supplementary check valves. The coolant tank temporarily stores a coolant. The main pumps are respectively arranged in a plurality of heat generators in the electronic system, and the main pumps supply the coolant from the coolant tank to the heat generators. The heat exchangers cool the coolant from each of the heat generators and return the coolant to the coolant tank. The common supplementary pump is operated when any one of the main pumps has failed and supplies the coolant from the coolant tank. Each of the supplementary check valves has an upstream side connected to an outlet port of the supplementary pump and downstream sides connected to outlet ports of the main pumps. Each of the supplementary check valves is opened when a pressure difference between the upstream side and the downstream side of each of the supplementary check valves is larger than a predetermined value.

4 Claims, 2 Drawing Sheets

COOLING APPARATUS FOR ELECTRONIC SYSTEM

Background of the Invention

The present invention relates to a cooling apparatus for an electronic system and, more particularly, to an extension type cooling apparatus having a plurality of cooling units.

A conventional extension type cooling apparatus having an arrangement shown in FIG. 2 is known.

FIG. 2 shows the arrangement of a conventional extension type cooling apparatus. In FIG. 2, reference numeral 1 denotes an electronic system. The electronic system 1 has a plurality of heat generators 2 (four heat generators in this prior art). Reference numeral 3 denotes an extension type cooling apparatus for cooling the heat generators 2. The extension type cooling apparatus 3 is constituted by a basic unit 4 and a plurality of extended units 5 serving as cooling units.

The basic unit 4 comprises a tank 7 for mixing a coolant 6 to average the temperature thereof, coolant supply pumps ( to be described later ) of the extended units 5, and a controller 8 for controlling the operation of the heat exchangers. The tank 7 communicates with coolant paths (not shown) of the heat generators 2 through coolant return pipes 9. Note that a coolant flow rate sensor 10 for detecting the flow rate of a coolant flowing in each of the coolant return pipes 9 is inserted in the corresponding coolant return pipe 9.

The controller 8 controls the coolant supply pumps, the heat exchangers, and the like on the basis of detection values of the coolant flow rate sensors 10.

Each of the extended units 5 comprises pumps 11 serving as coolant supply main pumps, check valves 12, communicating with the outlet ports of the pumps 11, for preventing a coolant from flowing back into the pumps 11, and a heat exchanger 13, communicating with the downstream sides of the check valves 12, for cooling a coolant.

The two pumps 11 and the two check valves 12 are arranged in each of the extended units 5. Each of the pumps 11 and each of the check valves 12 are connected in series with each other to obtain two systems in each of the extended units 5. The inlet ports of the two pumps 11 communicate with the tank 7 through a coolant supply pipe 14. For this reason, all of the pumps 11 of the extended units 5 communicate with the tank 7 through the coolant supply pipe 14.

The two check valves 12 communicate with each other on the downstream side and communicate with a coolant inlet port of the corresponding heat exchanger 13. The coolant outlet port of each of the heat exchangers 13 communicates with the coolant path of the corresponding heat generator 2.

That is, a coolant supplied to the heat generators 2 is supplied from the extended units 5.

In the extension type cooling apparatus having the above arrangement, the coolant 6 in the tank 7 is supplied to the extended units 5 by the operation of the pumps 11. The coolant 6 flows into the heat exchangers 13 through the pumps 11 and the check valves 12. The coolant 6 is cooled by the heat exchangers 13, and is supplied to the heat generators 2 to cool the heat generators 2. The coolant 6 flowing from the heat generators 2 is returned to the tank 7 through the coolant return pipes 9. The heat generators 2 are cooled by the above arrangement.

Only one of the two pumps 11 of each of the extended units 5 is always operated. If the controller 8 recognizes an abnormal operation of one of the two pumps 11 of each of the extended units 5, the operation of the abnormal pump 11 is stopped, and the operation of the normal pump 11 is started. That is, the controller 8 has a redundancy switching control function for continuing a cooling operation by switching the two pumps 11.

In the conventional extension type cooling apparatus with the above arrangement, however, since the two pumps 11 are arranged in each of the extended units 5 to control a redundancy switching operation during the failure of a pump, the number of pumps is twice the number of the extended units 5. For this reason, the structure of the extension type cooling apparatus is complicated which increase the size thereof. The production cost of the extension type cooling apparatus is increased.

SUMMARY OF THE INVENTION

It is an object of the present invention to provide a cooling apparatus for an electronic system in which the number of pumps is decreased to reduce the size and production cost of the cooling apparatus.

In order to achieve the above object, according to the present invention, a cooling apparatus for an electronic system comprises a coolant tank for temporarily storing a coolant. Main pumps are, respectively, arranged in a plurality of heat generators in the electronic system, for supplying the coolant from the coolant tank to the heat generators. Heat exchangers cool the coolant from each of the heat generators and returns the coolant to the coolant tank. A common supplementary pump is operated when any one of the main pumps has failed, for supplying the coolant from the coolant tank. Supplementary check valves have an upstream side connected to an outlet port of the supplementary pump and downstream sides connected to the outlet ports of main pumps. Each of the supplementary check valves is opened when a pressure difference between the upstream side and the downstream side of each of the supplementary check valves is larger than a predetermined value.

DESCRIPTION OF THE PREFERRED EMBODIMENTS

An embodiment of the present invention will be described below with reference to FIG. 1.

Figure 1:
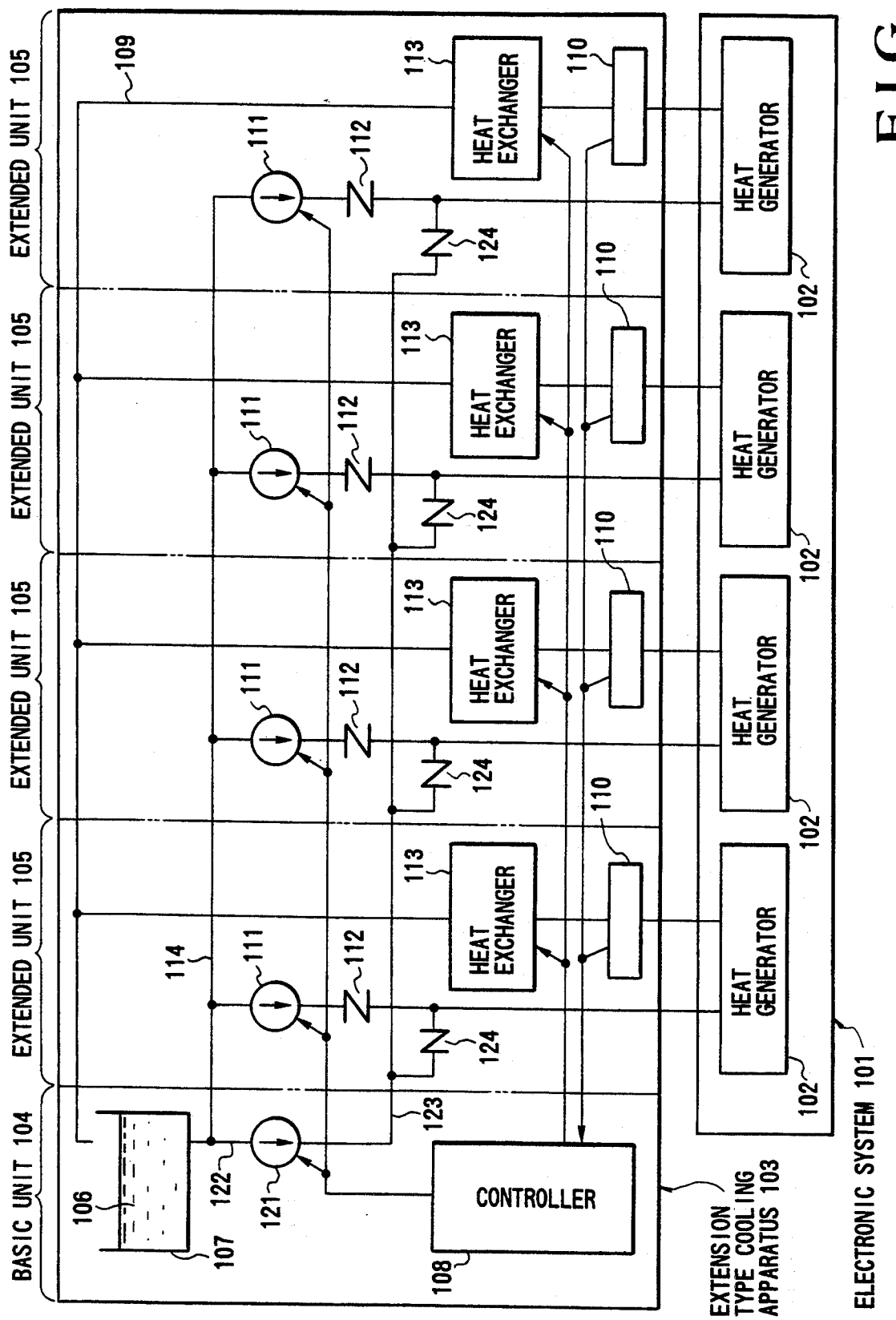
FIG. 1 is a view showing the arrangement of an extension type cooling apparatus according to the present invention.
Figure 2:
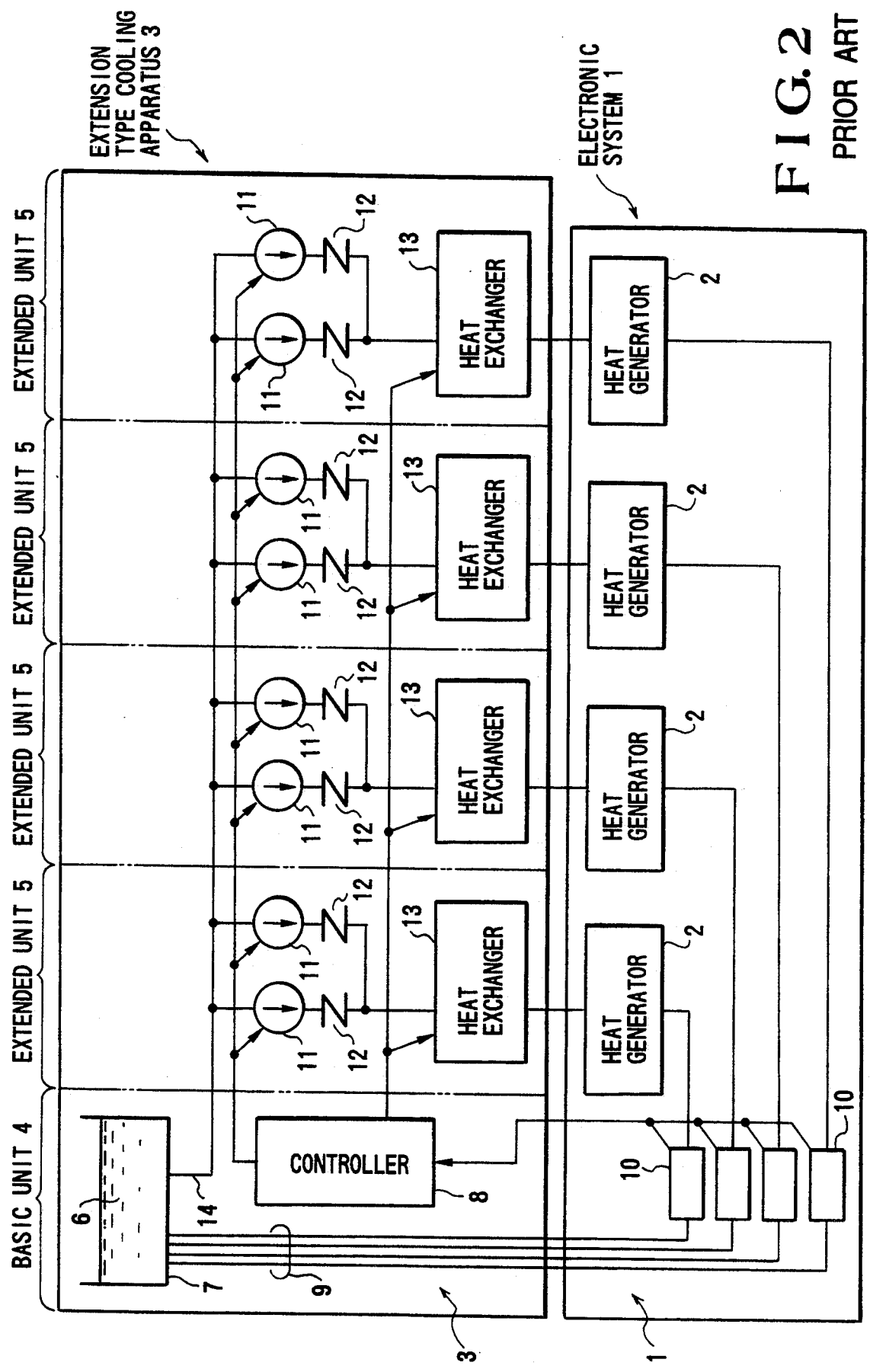
FIG. 2 is a view showing the arrangement of a conventional extension type cooling apparatus.

FIG. 1 shows the arrangement of an extension type cooling apparatus according to the present invention. In FIG. 1, reference numeral 101 denotes an electronic system 101. The electronic system 101 has a plurality of heat generators 102 (four heat generators in this embodiment). Reference numeral 103 denotes an extension type cooling apparatus for cooling the heat generators 102. The extension type cooling apparatus 103 is constituted by a basic unit 104 and a plurality of extended units 105 serving as cooling units.

The basic unit 104 of the extension type cooling apparatus 103 comprises a coolant tank 107 for mixing a coolant 106 to average the temperature of the coolant 106, a supplementary pump 121 operated when a coolant supply main pump has failed, and a controller 108 for controlling the operation of the supplementary pump 121, coolant supply main pumps 111 of the extended units 105 (to be described later), and heat exchangers 113. The inlet port of the supplementary pump 121 communicates with the coolant tank 107 through a supplementary supply pipe 122. The outlet port of the supplementary pump 121 is connected to the extended units 105 through a supplementary supply pipe 123.

Each of the extended units 105 comprises a coolant supply main pump 111 having an inlet port communicating with a coolant supply pipe 114 from the coolant tank 107, a check valve 112 having an upstream side communicating with the outlet port of the main pump 111 and a downstream side communicating with the corresponding heat generator 102 of the electronic system 101, a coolant flow rate sensor 110 inserted in a coolant return pipe 109 extending from the downstream side of the heat generator 102 to the coolant tank 107, and the heat exchanger 113 connected between the downstream side of the coolant flow rate sensor 110 and the coolant tank 107. That is, in this embodiment, a coolant flowing from the check valves 112 cools the heat generators 102, is cooled by the heat exchangers 113, and is returned to the coolant tank 107. The controller 108 controls the main pumps 111, the supplementary pump 121, the heat exchangers 113, and the like on the basis of the detection values obtained by the coolant flow rate sensors 110.

In addition, each of the extended units 105 has a supplementary check valve 124 constituted by a spring check valve. The downstream side of the check valve is connected to a coolant path between the check valve 112 and the corresponding heat generator 102. The upstream side of the supplementary check valve 124 is connected to the supplementary supply pipe 123 extending from the supplementary pump 121. Each of the supplementary check valves 124 has a structure for supplying a coolant from the supplementary supply pipe 123 to only the corresponding heat generator 102. The internal path of the supplementary check valve 124 is opened only when a pressure difference between the upstream side and the downstream side is larger than a predetermined value.

That is, when the main pumps 111 are normally operated to cause a normal pressure to act on the heat generators 102, a coolant does not flow through the supplementary check valves 124 even if the supplementary pump 121 is operated.

On the other hand, when the main pump 111 has failed to decrease the pressure of the downstream coolant path of the main pump 111, and the supplementary pump 121 is operated, the pressures of the upstream and downstream sides of the supplementary check valves 124 are set to be high and low, respectively. For this reason, the internal paths of the supplementary check valves 124 are opened. The coolant discharged from the supplementary pump 121 is supplied to the heat generators 102 through the supplementary check valves 124. Note that the operation of the supplementary pump 121 is controlled by the controller 108.

In the extension type cooling apparatus according to the present invention having the above arrangement, in a normal state, the main pumps 111 are operated to supply the coolant 106 from the coolant tank 107 to the heat generators 102 through the main pumps 111 and the check valves 112, thereby cooling the heat generators 102.

When a given main pump 111 has failed, the controller 108 stops this main pump 111 in response to a flow rate decrease detection signal from the coolant flow rate sensor 110, and the common supplementary pump 121 is operated. When the supplementary pump 121 is operated, the coolant 106 is discharged from the coolant tank 107 into the supplementary supply pipe 123 through the supplementary pump 121. The coolant 106 is supplied from the supplementary supply pipe 123 to the extended units 105. At this time, the supplementary check valve 124 is closed in each of the extended units 105 in which the main pumps 111 are normally operated. On the other hand, in the extended unit 105 in which the main pump 111 is stopped, the supplementary check valve 124 is opened because the pressure of the downstream side of the main pump 111 is low, thereby circulating the coolant 106.

The coolant 106 flowing through the open supplementary check valve 124 is supplied to the coolant path of the main pump 111 of the extended unit 105 in which the main pump 111 is stopped. The coolant 106 is supplied from the coolant path to the electronic system 101 so as to cool the heat generator 102 corresponding to the stopped main pump 111.

Therefore, when the supplementary pump 121 is operated when the main pump 111 of the extended unit 105 has failed, the coolant 106 discharged from the supplementary pump 121 is supplied to the corresponding heat generator 102 through the supplementary check valve 124 communicating with the downstream side of the main pump 111. In addition, the coolant 106 supplied from the supplementary pump 121 does not flow into the coolant path of the normal main pumps 111 because the supplementary check valves 124 are kept closed. Coolent 106 is not supplied to the corresponding heat generators 102. For this reason, even when the plurality of extended units 105 are arranged as shown, a redundancy switching function can be obtained by the single supplementary pump 121.

As has been described above, in a cooling apparatus of an electronic system according to the present invention, a supplementary check valve for causing the outlet port of a common supplementary pump to communicate with the downstream side of a check valve of each of main pumps is opened only when a pressure difference between the upstream side and downstream side of the corresponding pump is larger than a predetermined value. For this reason, when a main pump of a cooling unit has failed, a coolant discharged from the supplementary pump is supplied to a corresponding heat generator through the supplementary check valve communicating with the downstream side of the stopped main pump. On the other hand, the coolant supplied from the supplementary pump does not flow into the coolant path of a normal main pumps because the supplementary check valves of the non-defective main pumps are kept closed.

Therefore, even if a plurality of cooling units are arranged, a redundancy switching function can be obtained by a single common supplementary pump. For this reason, although 2N (N: the number of extended units) pumps are required in a conventional technique, a redundancy switching function can be obtained by (N+1) pumps in a cooling apparatus as a whole. For this reason, the structure of the cooling apparatus can be simplified, and the size and production cost of the cooling apparatus can be decreased.

What is claimed is:

1. A cooling apparatus for an electronic system, comprising:
   a coolant tank for temporarily storing a coolant;
   a plurality of main pumps, respectively, arranged in a plurality of heat generators in said electronic system, for supplying said coolant from said coolant tank to said heat generators, each of said main pumps having an outlet port;
   a plurality of heat exchangers individually associated with said heat generators for cooling said coolant from each of said heat generators and for returning said coolant to said coolant tank;
   a common supplementary pump, operated in response to a failure of any one of said main pumps, for supplying said coolant from said coolant tank, said common supplementary pump having an outlet port; and
   a plurality of supplementary check valves, each each of said check valves having an upstream side connected to said outlet port of said supplementary pump and having downstream sides connected to said outlet port of an individually associated one of said main pumps, each of said supplementary check valves being opened in response to a pressure difference larger than a predetermined value, said pressure difference being between the upstream side and the downstream side of each of said supplementary check valves.

2. An apparatus according to claim 1, further comprising a plurality of coolant flow rate sensors, each of said coolant flow rate sensors being arranged in an individually associated coolant circulating path extending from an associated one of said heat generators to said coolant tank, and control means for operating said supplementary pump in response to a flow rate decrease detection output from said coolant flow rate sensors.

3. An apparatus according to claim 1, further comprising a plurality of main check valves respectively connected to individually associated outlet ports of said main pumps, each of said main check valves having a downstream side, and wherein the upstream sides of said supplementary check valves are respectively connected to downstream sides of said main check valves.

4. An apparatus according to claim 1, wherein said cooling apparatus comprises a basic unit having said coolant tank and said supplementary pump and a plurality of extended units, each of said extended units having said heat exchanger and said supplementary check valve, each of each main pumps having an inlet port, said inlet ports of said main pumps being commonly connected to a coolant supply path extending from said coolant tank, each of said heat exchangers having a downstream side commonly connected to a coolant circulating path extending to said coolant tank, and said upstream sides of said supplementary check valves being commonly connected to a supplementary supply path extending from said supplementary pump.

* * * * *